United States Patent [19]

Reichert et al.

[11] Patent Number: 4,808,542
[45] Date of Patent: Feb. 28, 1989

[54] PROCESS FOR THE STABILIZATION OF PN JUNCTIONS

[75] Inventors: Hansjoerg Reichert; Ludwig Scharf; Margarete Deckers, all of Munich, Fed. Rep. of Germany

[73] Assignee: Siemens Aktiengesellschaft, Berlin and Munich, Fed. Rep. of Germany

[21] Appl. No.: 84,525

[22] Filed: Aug. 10, 1987

[30] Foreign Application Priority Data

Aug. 11, 1986 [DE] Fed. Rep. of Germany ....... 3627209

[51] Int. Cl.$^4$ ......................................... H01L 21/425
[52] U.S. Cl. ..................................... 437/20; 437/228; 437/947; 156/653
[58] Field of Search .................. 437/20, 947, 228; 156/653

[56] References Cited

U.S. PATENT DOCUMENTS

| | | | |
|---|---|---|---|
| 3,764,423 | 10/1973 | Hauser, Jr. et al. | 156/3 |
| 3,771,218 | 11/1973 | Langdon | 156/11 |
| 4,084,987 | 4/1978 | Godber | 437/20 X |
| 4,135,954 | 1/1979 | Chang et al. | 437/228 X |
| 4,244,752 | 1/1981 | Henderson, Sr. et al. | 357/34 |
| 4,382,827 | 5/1983 | Romano-Moran et al. | 437/228 X |
| 4,412,378 | 11/1983 | Shinada | 437/20 |
| 4,442,592 | 4/1984 | Kemmer | 437/20 X |
| 4,635,090 | 1/1987 | Tamaki et al. | 437/947 |

FOREIGN PATENT DOCUMENTS 2168194 6/1986 United Kingdom .

OTHER PUBLICATIONS

IBM Technical Disclosure Bulletin, vol. 24, No. 9, Feb. 1982, pp. 4728 and 4729, Dalal et al.

Primary Examiner—George T. Ozaki
Attorney, Agent, or Firm—John Francis Moran

[57] ABSTRACT

In a process for the stabilization of a PN junction an oxide layer (12) is produced on a semiconductor substrate (11), and above this layer a nitride layer (13) is also produced. The oxide layer (12) is wet-chemically etched following the formation and etching of the nitride layer (13). Following the wet chemical etching of the oxide layer (12), the overlapping nitride (13) is re-etched. Dopant implantation takes place in the wet-chemically-etched region. This then is followed by a diffusion. A process of this type achieves high electrical stability for an electronic component. Thereupon, the photoresist (14) or any other type of layer covering the nitride (13) is removed.

17 Claims, 1 Drawing Sheet

PROCESS FOR THE STABILIZATION OF PN JUNCTIONS

BACKGROUND OF THE INVENTION

This invention relates to a process for the stabilization of PN junctions, and it relates, more particularely, to a hermetic passivation process involving the layering of silicon dioxide and silicon nitride.

A thorough passivation of a microwave transistor requires the application of a silicon nitride layer in the active region. Since the silicon nitride layer, for various reasons, should not be applied directly to the silicon, it is the present conventional practice to deposit the silicon nitride layer over a silicon dioxide layer, or the silicon dioxide layer is partially converted by a nitrating atmosphere into a silicon nitride layer. In all these foregoing situations, there is a double passivation layer, consisting of silicon dioxide deposited directly upon the substrate, and of silicon nitride deposited upon the silicon dioxide. This double passivation layer must be structured as a whole in a completed sequence of steps.

The present state of the processing for the structuring of a passivation double layer, consisting of silicon nitride deposited upon the silicon dioxide, is described in FIGS. 1 through 4.

FIG. 1 depicts a semiconductor substrate 1 upon which is deposited an oxide layer 2 with a silicon nitride layer 3 deposited thereon.

If, for example, it is desired to form emitter strips in PNP silicon high frequency transistors by means of the process shown in FIG. 1, the region underlying the base region is a p-type region. A thin silicon dioxide layer of, for example, 30 nm thickness can be produced thermally as an oxide layer 2. However, the silicon dioxide layer can also be deposited by means of a CVD process. For example, a 120 nm thick $Si_3N_4$ layer can be produced as a silicon nitride layer 3. The silicon nitride layer 3 can also be produced by nitrating the oxide layer 2 in a nitrating atmosphere or by CVD depositing. A layer produced at high temperature can be used as a silicon nitride layer 3. A silicon oxinitride layer can also be used as a silicon nitride layer. After the double passivation layer has been deposited, the state of the art process typically involves structuring the silicon nitride layer 3 by means of a photolithographic process. Thereupon, the resist mask used in the photolithographic process is removed. The structure thus formed is shown in FIG. 2. After the silicon nitride layer 3 has been formed, the oxide layer 2 is structured or patterned by means of a wet chemical etching process. The result of this process is illustrated in FIG. 3.

Following the formation of the double passivation layer, next an implantation and a subsequent diffusion for producing the emitter 4 which is n-doped. The result of this procedural sequence is shown in FIG. 4.

During the wet chemical etching of the oxide 2, the oxide 2 is unavoidably undercut. This undercut of the oxide 2 produces cavities or openings in the double passivation layer, which cannot be closed through the subsequent application of state of the art processes.

During the emitter implantation, the overlapping overhanging nitride 3 produces a shading of the boundary areas of the exposed silicon, which consequently are not provided with implantation particles. Thus, during the subsequent emitter diffusion it cannot always be ensured that the emitter region 4 diffuses laterally to the underside of the oxide 2. Even when the PN junction between the emitter 4 and the subsequent p-doped region of the silicon 1 is completely covered by the oxide 2, the aforementioned cavities lead to malfunctions. These cavities can become coupled or exposed to the outside atmosphere of the electronic component and may thus function as gas conduits. As a consequence, interfering substances—in particular hydrogen—will enter the vicinity of the PN junction and thus lead to electrical instability of the electronic component.

The following process will serve to eliminate the nitride overlap: following the wet chemical etching of the oxide 2, the nitride layer 3, i.e., without being covered with resist or any other type of layer, is overetched over the entire area, until the nitride 3 only has one half of the original layer thickness. Since the overlapping nitride 3 is attacked both from the bottom and the top when the entire area is overetched, the overlap of the nitride 3 breaks off, thus preventing cavity formation. The protective nitride layer retains an adequate thickness.

However, in the application of the foregoing process, the overetching with nitride of the entire area presents a problem. Specifically, the etching of the nitride 3 produces an uneven effect, thus resulting in a varying nitride thickness. A further disadvantage is that the nitride edge always coincides with the oxide edge after the entire area has been overetched with nitride. This results in very steep abrupt change in the surface having a step height corresponding to the thickness of the nitride and oxide passivation double layer. During the subsequent metallization, very abrupt steps can increasingly lead to breaks in the metal and thus reduce operation, yield and reliability.

SUMMARY OF THE INVENTION

It is therefore an object of the present invention to provide a process of the aforementioned type which achieves high electrical stability from electronic components.

The advantages and refinements of the invention are specified in the subsequent claims, the specifications, and the drawings.

In a process according to the invention, cavities associated with exposure of PN junctions are avoided.

A process according to the invention is suitable particularly for the stabilization of flat PN junctions.

By additional re-etching of the overlapping nitride and the subsequent removal of the resist covering the nitride layer or any other type of layer covering the nitride, the nitride is removed, thus preventing the formation of cavities. By selecting a suitable etching interval when re-etching the overlapping nitride, any type of desired step profile of the oxide-nitride passivation double layer can be formed.

Furthermore, there will be no shielding during the emitter implantation process. As a result, the base-emitter PN junction is located as far as possible underneath the oxide after diffusion has taken place.

The thickness of the oxide should be sufficient to mask against the emitter implantation.

The invention is not limited to the stabilization of base-emitter junctions. The invention is suitable for producing PN junctions.

A process according to the invention offers the following advantages.

1. By applying a process according to the invention, cavities—which act as gas conduits in the active region of a transistor or any other electronic component and destabilize the component concerned—can be prevented.

2. A process according to the invention which enables the PN junctions to be positioned as far as possible underneath the oxide layer, so there will no longer occur shading when producing the PN junction, for example, during the emitter implantation.

3. A process according to the invention which enables the maintenance of the nitride layer as a diffusion barrier above the oxide in the active transistor region.

The electronic component is thus already hermetically sealed after the metallization process, which, however, is not the case in a state of the art process.

4. In a process according to the invention, the lateral undercut of the nitride underneath the resist or any other layer covering the nitride may be controlled when re-etching the nitride overlap, so that a flat step profile of the oxide and nitride passivation double layer is produced. This markedly reduces the risk of metal breaks during subsequent metallization. Hence a common drawback related to the usual undercutting, by utilization of the principles of the invention converted into a desirable event leading to greater device reliability.

5. A process according to the invention can easily be integrated in common production processes.

When the overlapping nitride is re-etched, the photoresist covering the nitride or another layer covering the nitride prevents the entire nitride surface from being overetched and thus prevents a reduction of the nitride thickness, as well as a varying nitride thickness.

BRIEF DESCRIPTION OF THE DRAWING

Features of the invention and additional objects of the invention will be more readily appreciated and better understood by reference to the following detailed description which should be considered in conjunction with the drawing.

An illustrative embodiment of the invention is shown schematically in the drawing.

FIG. 5 illustrates that a silicon dioxide layer 12, having a thickness of more than 100 nm, is deposited upon a p-doped silicon semiconductor 11, or is produced by some other means, and that upon said oxide layer 12 a silicon nitride ($Si_3N_4$) layer 13 is produced, having, for example, a thickness of 120 nm.

FIG. 6 depicts the nitride layer 13 being structured by means of a photoresist 14 using a photolithographic process. The resist masks 14 remains intact.

FIG. 7 demonstrates the resulting formation according to FIG. 6 following the wet chemical of the oxide 12 by means of the combined nitride and resist mask.

FIG. 8 illustrates the resulting formation of FIG. 7 following the re-etching of the overlapping or overhanging nitride and following the subsequent removal of the photoresist 14. An advantage of the techniques used in exercising the principles of the present invention is that standard and well understood process steps are utilized. For example, the wet-chemical etching of the silicon oxide is performed by using conventional buffered hydrofluoric acid (HF). To etch the nitride layer, those skilled in the art have the option of using phosphoric acid or dry-etching media. For etching of oxide coating, U.S. Pat. No. 3,558,375 entitled "Variable Capacity Diode Fabrication Method with Selective Diffusion of Junction Region Impurities" discloses oxide etching techniques known since 1971. For etching silicon nitride, U.S. Pat. No. 3,479,237 entitled "Etch Masks on Semiconductor Surfaces" discloses a very common way of etching nitride layers in use since 1969. Still further information is available from the Journal of Electrochemical Society, Vol. 115, No. 3, Mar. 3, 1968 at pages 311–317.

FIG. 9 depicts the resulting formation of FIG. 8 following the production of an n-doped emitter 15 following the emitter implantation including the subsequent emitter diffusion.

Figure 1:
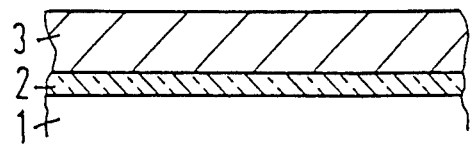
FIGS. 1 through 4 illustrate the present state of the art process.
Figure 2:
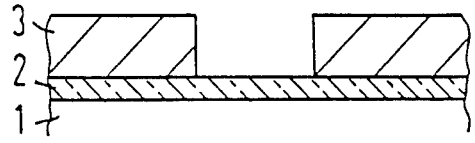
Figure 3:
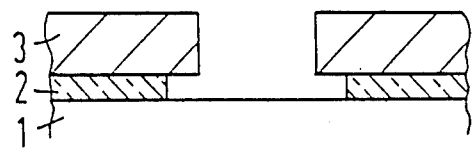
Figure 4:
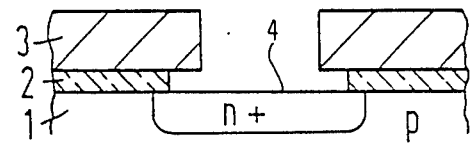
Figure 5:
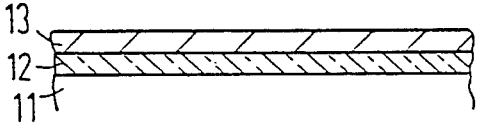
FIGS. 5 through 9 demonstrate a process in accordance with the principles of the present invention.
Figure 6:
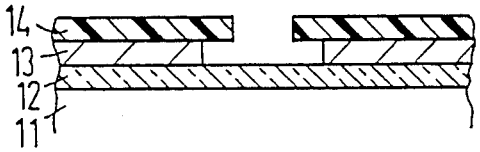
Figure 7:
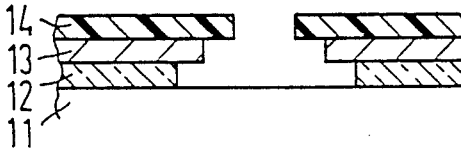
Figure 8:
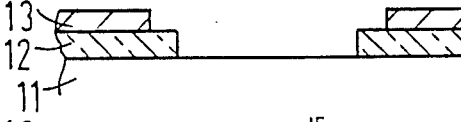
Figure 9:
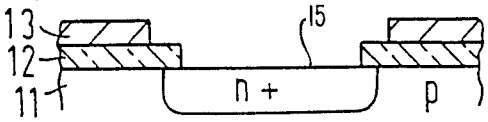

There has thus been shown and described a novel device processing technique for hermetically passivating junctions which fulfulls all the objects and advantages sought therefor. Many changes, modifications, variations and other uses and applications of the subject invention will, however, become apparent to those skilled in the art after considering this specification and the accompanying drawing which disclose the preferred embodiments thereof. All such changes, modifications, variations and other uses and applications which do not depart from the spirit and scope of the invention are deemed to be covered by the invention which is limited only by the claims which follow.

What is claimed is:

1. A method for the stabilization of a PN junction, the method comprising the steps of:
    (a) providing an oxide layer on a semiconductor substrate located above an area of a first doping type;
    (b) producing a nitride layer on the oxide layer;
    (c) patterning the nitride layer photolithographically by means of a photoresist to produce at least one exposed area of the nitride layer and etching the at least one exposed area to form at least one window in the nitride layer;
    (d) chemically etching the oxide layer via the at least one window to remove at least one exposed portion of the oxide layer while producing an overlapping nitride region around the window;
    (e) re-etching, subsequent to the step of chemical etching of the oxide, the overlapping nitride region;
    (f) via the window, implanting particles of a second doping type, which is opposite to those of the first doping type, followed by a diffusion; and,
    (g) subsequently removing the photoresist from the nitride.

2. A method as defined by claim 1, wherein the semiconductor substrate comprises silicon.

3. A method as defined in claim 2, wherein the oxide comprises silicon oxide.

4. A method as defined in claim 2, wherein the nitride comprises silicon nitride.

5. A method as defined in claim 1, comprises producing a step profile of the oxide and nitride double passivation layer.

6. A method as defined in claim 1, wherein the oxide layer has a thickness of more than 100 nm.

7. A method as defined in claim 2, wherein the oxide layer has a thickness of more than 100 nm.

8. A method as defined in claim 2 wherein the nitride layer has a thickness of more than 100 nm.

9. A method as defined in claim 1, wherein the oxide comprises silicon oxide.

10. A method as defined in claim 9, wherein the nitride comprises silicon nitride.

11. A method as defined in claim 9, wherein the oxide layer has a thickness of more than 100 nm.

12. A method as defined in claim 9 wherein the nitride layer has a thickness of more than 100 nm.

13. A method as defined in claim 1, wherein the nitride comprises silicon nitride.

14. A method as defined in claim 13, wherein the oxide layer has a thickness of more than 100 nm.

15. A method as defined in claim 13 wherein the nitride layer has a thickness of more than 100 nm.

16. A method as defined in claim 1 wherein the nitride layer has a thickness of more than 100 nm.

17. A method for stabilizing a PN junction, the method comprising the steps of:

(a) providing an oxide layer on a surface of a semiconductor wafer, the surface being located above an area of a first doping type in the semiconductor wafer;

(b) providing a nitride layer on the oxide layer;

(c) providing a patterned layer on the nitride layer to produce at least one exposed portion;

(d) etching the exposed portion of the nitride layer to expose the oxide layer;

(e) chemically etching the exposed portion of the oxide layer while peripherally undercutting and forming an overhanging nitride region;

(f) etching the overhanging nitride region;

(g) implanting particles of a second doping type, which is opposite to those of first doping type into a portion of the area corresponding to removed nitride, followed by a diffusion; and, (h) removing the patterned layer from the nitride.

* * * * *